(12) United States Patent  (10) Patent No.: US 7,709,899 B2
Agari et al.  (45) Date of Patent: May 4, 2010

(54) SEMICONDUCTOR APPARATUS

(75) Inventors: Hideki Agari, Osaka (JP); Kohji Yoshii, Hyogo (JP); Tsugunori Okuda, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 690 days.

(21) Appl. No.: 10/594,542

(22) PCT Filed: Mar. 29, 2005

(86) PCT No.: PCT/JP2005/006550

§ 371 (c)(1),
(2), (4) Date: Sep. 27, 2006

(87) PCT Pub. No.: WO2005/096370

PCT Pub. Date: Oct. 13, 2005

(65) Prior Publication Data

US 2007/0187763 A1     Aug. 16, 2007

(30) Foreign Application Priority Data

Mar. 31, 2004 (JP) ............................. 2004-104136

(51) Int. Cl.
*H01L 23/62* (2006.01)
(52) U.S. Cl. ............................. 257/358; 257/E23.011
(58) Field of Classification Search ......... 257/355–363, 257/E23.02, E23.011
See application file for complete search history.

(56) References Cited

U.S. PATENT DOCUMENTS 4,757,363 A * 7/1988 Bohm et al. ................. 257/358
5,066,999 A   11/1991 Casper
5,218,222 A * 6/1993 Roberts ....................... 257/362
5,867,418 A   2/1999 Okasaka et al.

FOREIGN PATENT DOCUMENTS

| JP | 59-81045 | 5/1984 |
|---|---|---|
| JP | 61-264748 | 11/1986 |
| JP | 64-68961 | 3/1989 |
| JP | 1-184819 | 7/1989 |
| JP | 1-212461 | 8/1989 |
| JP | 2-87674 | 3/1990 |
| JP | 2-306663 | 12/1990 |
| JP | 3-173468 | 7/1991 |
| JP | 4-218944 | 8/1992 |
| JP | 4-349640 | 12/1992 |

(Continued)

OTHER PUBLICATIONS

Feb. 27, 2008 European search report in connection with corresponding European patent application No. 05 72 1690.

*Primary Examiner*—Kenneth A Parker
*Assistant Examiner*—Paul A Budd
(74) *Attorney, Agent, or Firm*—Cooper & Dunham LLP

(57) ABSTRACT

A semiconductor apparatus is disclosed. The semiconductor apparatus comprises a substrate with a pad, an internal circuitry region, and a protection resistance formed on the substrate. The pad is connected to a first electrode of the protection resistance by wiring, the internal circuitry region is connected to a second electrode of the protection resistance by wiring, and the protection resistance protects the internal circuitry region from electrostatic discharging. The semiconductor apparatus is characterized in that the pad is placed between the protection resistance and the internal circuitry region.

10 Claims, 8 Drawing Sheets

FOREIGN PATENT DOCUMENTS

| | | |
|---|---:|---:|
| JP | 6-151814 | 5/1994 |
| JP | 6-169061 | 6/1994 |
| JP | 6-188369 | 7/1994 |
| JP | 6-224302 | 8/1994 |
| JP | 8-46142 | 2/1996 |
| JP | 8-88195 | 4/1996 |
| JP | 8-136482 | 5/1996 |
| JP | 8-181219 | 7/1996 |
| JP | 8-241992 | 9/1996 |
| JP | 9-17954 | 1/1997 |
| JP | 9-82938 | 3/1997 |
| JP | 9-116097 | 5/1997 |
| JP | 9-232401 | 9/1997 |
| JP | 9-306967 | 11/1997 |
| JP | 10-125914 | 5/1998 |
| JP | 11-220094 | 8/1999 |
| JP | 11-238655 | 8/1999 |
| JP | 3340535 | 8/2002 |
| JP | 2003-273154 | 9/2003 |
| JP | 2004-146548 | 5/2004 |
| JP | 2004-193475 | 7/2004 |

\* cited by examiner

SEMICONDUCTOR APPARATUS

TECHNICAL FIELD

The present invention generally relates to semiconductor apparatuses and especially relates to a semiconductor apparatus having a protection circuit for protecting the apparatus from electrostatic breakdown.

BACKGROUND ART

Conventional semiconductor apparatuses are equipped with a protection circuit at the inner side of an input pad thereof, in order to prevent the semiconductor apparatuses from breaking down due to electrostatic current, as shown in Japanese Patent Laid-Open Publication No. 9-17954, for example.

FIG. 8 shows a circuit diagram of such a conventional semiconductor apparatus 1000 having a protection circuit. The semiconductor apparatus 1000 is equipped with a protection circuit 50 between an input part (IN) 6 and semiconductor devices 10. The protection circuit 50 comprises a protection resistance 2 and a protection transistor 9 functioning as a diode.

In the protection circuit 50, electrostatic electricity (charges) input at the input part (IN) flows through the protection resistance 2, resulting in reducing the electrostatic voltage and protecting internal semiconductor devices. In a case where the voltage input at the input part is very high and cannot be reduced enough by the protection resistance 2, the protection transistor 9 turns ON and allows the electrostatic charges to flow down to the ground Vss to protect the internal semiconductor devices 10. In this specification and claims, the protection transistor and devices in the semiconductor device side are collectively referred to as "internal circuitry".

FIG. 9 is a cross-sectional view of the semiconductor apparatus 1000. An input pad 6 is formed integrally with a metal wiring layer (ME1) 5. A protection resistance 2 is formed by an N-well in a semiconductor substrate 1. In the N-well, a first electrode 3 of an N+ region and a second electrode 4 of an N+ region are provided. The first electrode 3 is connected to the input pad 6 via the metal wiring layer (ME1) 5. The second electrode 4 is connected to a drain of a protection transistor 9 via another metal wiring layer (ME2) 7. A gate and a source of the protection transistor 9 are shorted and connected to ground Vss. The semiconductor devices in the internal circuitry are connected to the metal wiring layer (ME2) 7.

In order to supply the semiconductor apparatus with electric power, a P+ region independently formed in the silicon substrate 1 is connected to ground Vss, and an N+ region independently formed in the silicon substrate 1 is connected to a positive power supply Vdd.

The semiconductor apparatus 1000 is fully covered and insulated with an oxide layer 8, except an opening for the input pad 6. The metal wiring layer (ME1) 5 of the input pad 6 and the silicon substrate 1 are insulated with the silicon oxide layer 8.

As mentioned above, when high voltage static electricity is applied to the input pad 6, the electrostatic current normally flowing from the input pad 6 through the metal wiring layer (ME1) 5 and the protection resistance 2 to the metal wiring layer 7 (ME2), further flows through the drain and source of the protection transistor 9 to ground Vss. As a result, the internal semiconductor devices connected to the metal wiring layer (ME2) are not damaged.

There are other routes in which the electrostatic current flows from the first electrode 3 of the protection resistance 2, such as through the N-well region, to the positive power supply Vdd, or to ground Vss.

However, as shown in FIG. 10, in the conventional semiconductor apparatus 1000 the protection resistance 2 is placed between the input pad 6 and the internal circuitry 10. The first electrode 3 of the protection resistance 2 has substantially the same electrical potential as the input pad 6, and the first electrode 3 is formed in the silicon substrate 1; therefore electric discharge (leakage) occurs from the first electrode 3 to other circuitry formed in the silicon substrate 1, especially to semiconductor devices formed in the internal circuitry region 10, resulting in the breakdown of the semiconductor devices. In order to prevent such electric discharge, a length L2 between the internal circuitry region 10 and the first electrode 3 needs to be increased, but that makes it difficult to miniaturize and highly integrate semiconductor devices.

As shown in FIG. 11, in a case where the input pad 6 is placed at a peripheral portion of the semiconductor apparatus 1100, especially adjacent to a corner, a length L3 between the internal circuitry region 10 and the first electrode 3 needs to be further increased, making it more difficult to miniaturize the semiconductor apparatus 1100.

SUMMARY

In an aspect of this disclosure, there is provided a semiconductor apparatus having a protection circuit, which can prevent electric discharge between an electrode of the protection circuit and other semiconductor devices and allow the miniaturization and integration of the apparatus.

In another aspect of this disclosure, there is provided a semiconductor apparatus comprising a substrate with a pad, an internal circuitry region, and a protection resistance formed on the substrate;

the pad being connected to a first electrode of the protection resistance by wiring;

the internal circuitry region being connected to a second electrode of the protection resistance by wiring; and the protection resistance protecting the internal circuitry region from electrostatic discharging;

wherein the pad is placed between the protection resistance and the internal circuitry region.

In the semiconductor apparatus, the distance between the pad and the first electrode and the distance between the pad and the second electrode may be substantially the same.

In another aspect of this disclosure, there is provided a semiconductor apparatus comprising a substrate with a pad, an internal circuitry region, and a protection resistance formed on the substrate;

the pad being connected to a first electrode of the protection resistance by wiring;

the internal circuitry region being connected to a second electrode of the protection resistance by wiring; and the protection resistance protecting the internal circuitry region from electrostatic discharging;

wherein the distance between the first electrode and the internal circuitry region is greater than the distance between the second electrode and the internal circuitry region.

In the semiconductor apparatus, the substrate may be provided with a guard ring region surrounding the pad, the internal circuitry region, and the protection resistance; and distances from two sides of the first electrode, the first electrode being rectangular, to the guard ring region adjacent to the first electrode may be substantially equal.

The protection resistance may comprise a well region formed in the substrate; and distances from the two sides of the first electrode to edge portions of the well region adjacent to the first electrode may be substantially equal.

Distances from two edge portions of the well region to the guard ring region adjacent to the well region may be substantially equal.

The pad may be placed on an insulating layer on the protection resistance.

The protection resistance may be formed by an impurity diffusion layer.

In the semiconductor apparatus, a protection circuit may be formed by the protection resistance and a protection transistor included in the internal circuitry region.

BEST MODE FOR CARRYING OUT THE INVENTION

In the following, embodiments of the present invention are described with reference to the accompanying drawings.

First Embodiment

Figure 1:
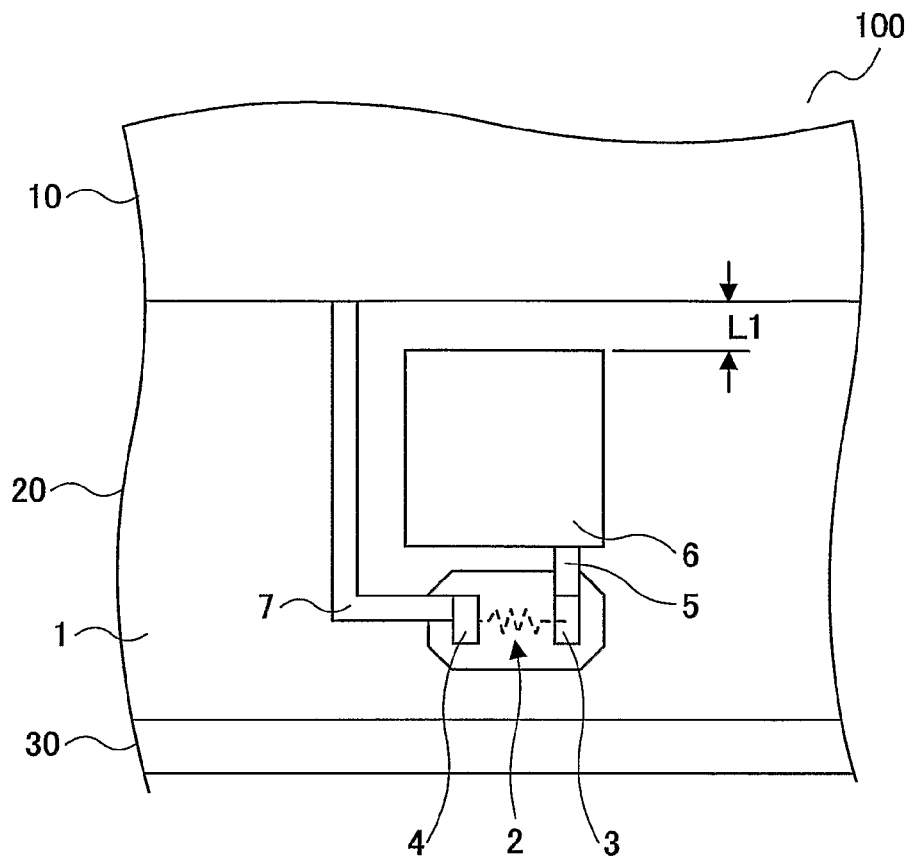
FIG. 1 is a partial layout diagram of a semiconductor apparatus according to a first embodiment of the present invention.

FIG. 1 is a partial layout diagram of a semiconductor apparatus 100 according to a first embodiment of the present invention.

The semiconductor apparatus 100 includes a silicon substrate 1, an internal circuitry region 10 formed on the silicon substrate 1, and a peripheral device region 20 formed around the internal circuitry region 10. The peripheral device region 20 is surrounded by a guard ring region 30. The guard ring region 30 arranged around the chip is formed by a diffusion layer and connected to a metal wiring layer mentioned below in order to obtain a substrate electric potential. Further, the guard ring region 30 plays a role of preventing the chip from suffering damage when dicing the chip.

The peripheral device region 20 is provided with a protection resistance (electrostatic discharge protection resistance) 2, which comprises an n-well formed in the p-type silicon substrate 1. The protection resistance 2 is provided a first electrode 3 of an $n^+$ region and a second electrode 4 of an $n^+$ region.

Figure 8:
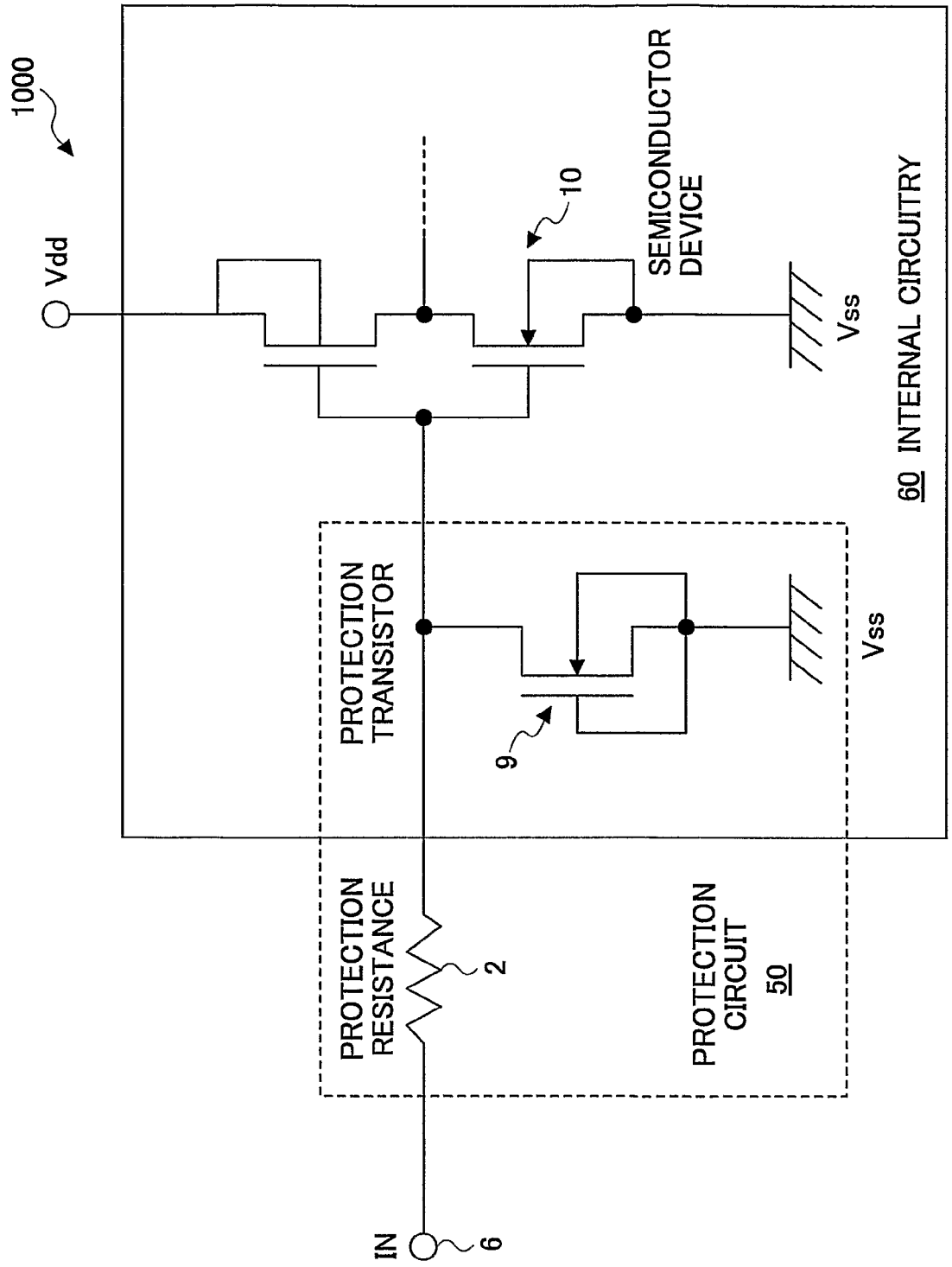
FIG. 8 is a circuit diagram of a conventional semiconductor apparatus having a protection circuit.

The first electrode 3 is connected to the input pad 6 via a metal wiring layer (ME1) 5. On the other hand, the second electrode 4 is connected via a metal wiring layer (ME2) 7 to the protection transistor and semiconductor devices formed in the internal circuitry region 10. This circuit structure is similar to that in the semiconductor apparatus 1000 shown in FIG. 8. The metal wiring layers 5, 7 and the input pad 6 are made of aluminum or poly-silicon, for example.

Figure 9:
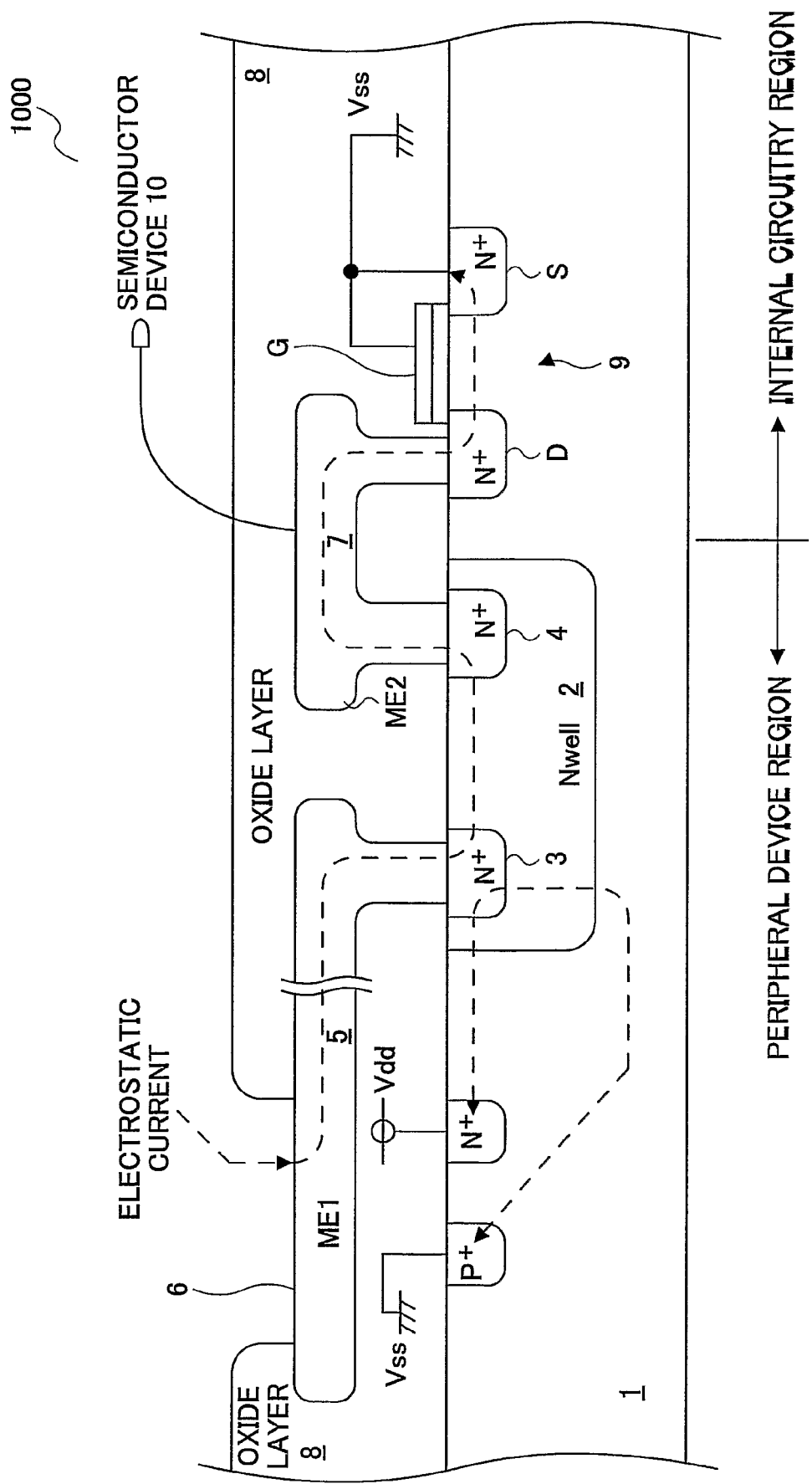
FIG. 9 is a partial cross-sectional view of the conventional semiconductor apparatus having the protection circuit of FIG. 8.
Figure 10:
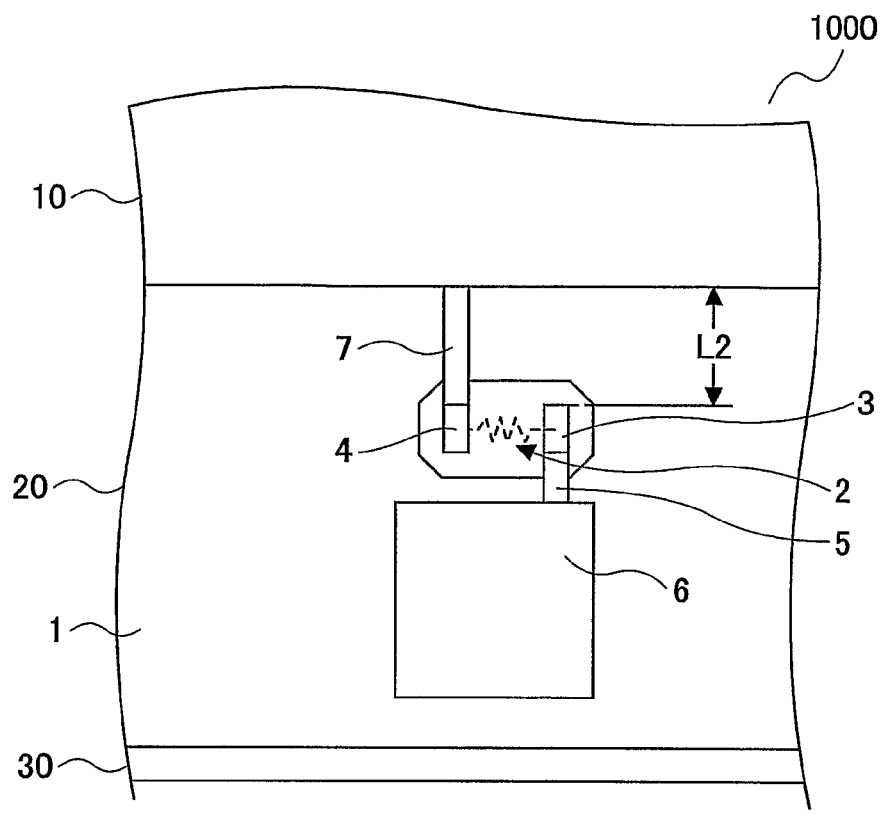
FIG. 10 is a partial layout diagram of the conventional semiconductor apparatus of FIG. 8.
Figure 11:
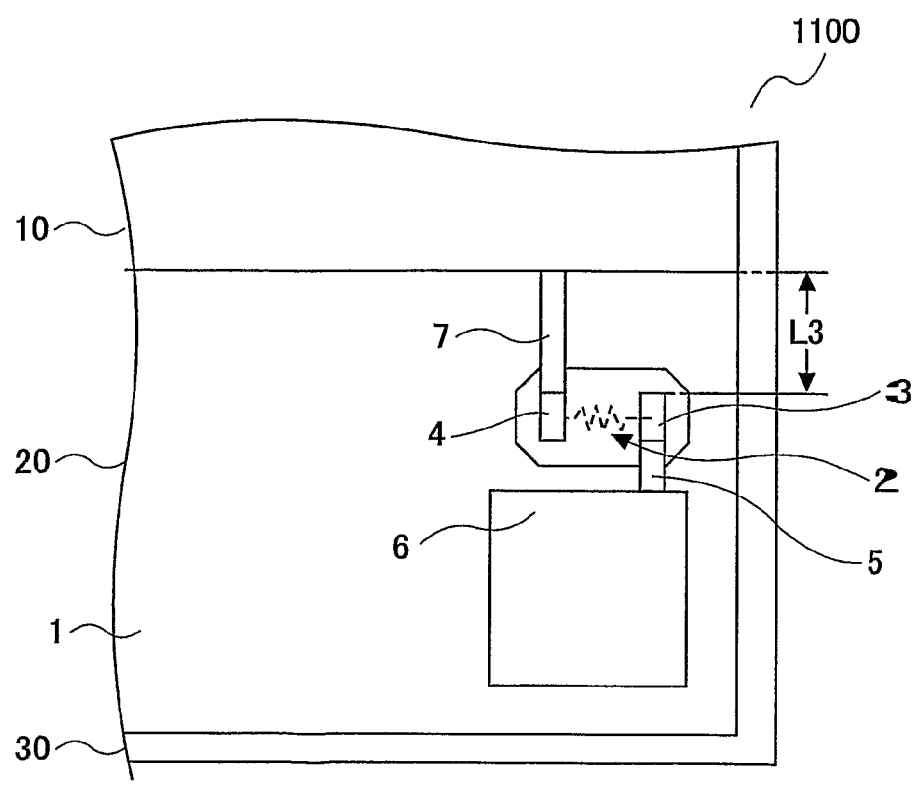
FIG. 11 is a partial layout diagram of another conventional semiconductor apparatus.

Similar to the semiconductor device 1000 shown in FIG. 9, a silicon oxide layer (not shown) is formed on the silicon substrate 1, and the metal wiring layers 5, 7 and the input pad 6 are formed on the silicon oxide layer. Since a silicon oxide layer has extremely high insulating characteristics even if it is thin, high dielectric strength can be kept even when the input pad 6 becomes close to the internal circuitry region 10. Therefore, the length L1 between the input pad 6 and the internal circuitry region 10 can be less than the length L2 between the first electrode 3 and the internal circuitry region 10 shown in FIG. 10.

In the semiconductor apparatus 100 shown in FIG. 1, the input pad 6 is placed between the internal circuitry region 10 and the protection resistance 2. Because of this arrangement, the distance between the first electrode 3 of the protection resistance 2 and the internal circuitry region 10 can be kept long enough.

In the semiconductor apparatus 100, while keeping the distance between the first electrode 3 and the internal circuitry region 10 long, it is possible to shorten the distance L1 between the internal circuitry region 10 and the adjacent input pad 6 compared with the distance L2 between the internal circuitry region 10 and the first electrode 3 of the adjacent protection resistance 2 in the conventional semiconductor apparatus 1000.

The layout according to the first embodiment of the present invention makes it possible to increase the area of the internal circuitry region 10 in a constant size semiconductor apparatus and enables high integration. But if the area of the internal circuitry region 10 is held constant, it is possible to miniaturize the semiconductor apparatus and reduce manufacturing cost.

Second Embodiment

Figure 2:
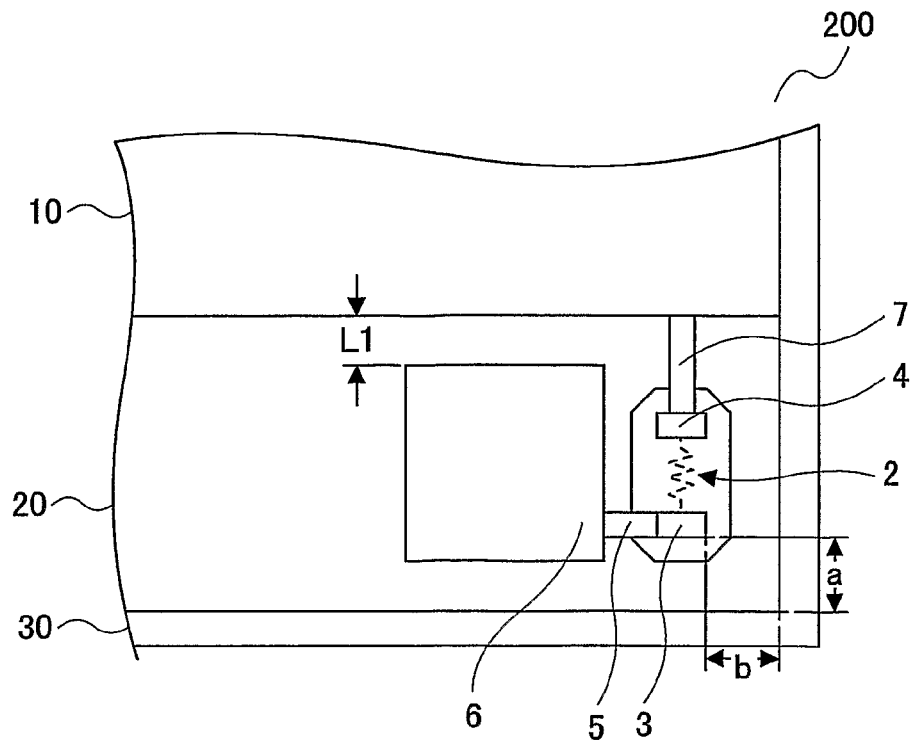
FIG. 2 is a partial layout diagram of a semiconductor apparatus according to a second embodiment of the present invention.

FIG. 2 is a partial layout diagram of a semiconductor apparatus 200 according to a second embodiment of the present invention. In this embodiment, an input pad 6 is placed near a corner of the semiconductor apparatus 200. The same or similar reference numerals shown in FIG. 2 indicate parts that are the same as or similar to parts shown in FIG. 1.

As shown in FIG. 2, a protection resistance 2 is placed near a corner of the semiconductor apparatus 200. A first electrode 3 and a second electrode 4 of the protection resistance 2 are placed at substantially the same distance from one side of a guard ring region 30 surrounding a peripheral device region 20. In other words, the longitudinal axis of the protection resistance 2 is substantially parallel to the one side of the guard ring region 30.

The input pad 6 is placed at the other side of the protection resistance 2 from the one side of the guard ring region 30. One side of the input pad 6 is substantially parallel to an internal circuitry region 10, and the distance between them is L1, the same as that in the semiconductor apparatus 100 mentioned above.

The first electrode 3 of the protection resistance 2 is connected to the input pad 6 by a metal wiring layer 5. The metal wiring layer 5 is placed perpendicular to the longitudinal axis of the protection resistance 2, and along one side of the guard ring region 30. On the other hand, the second electrode 4 of the protection resistance 2 is connected to the internal circuitry region 10 by a metal wiring layer 7. The metal wiring layer 7 is placed to extend from the longitudinal axis of the protection resistance 2 and along one side of the guard ring 30.

As shown in FIG. 2, the rectangular first electrode 3 is arranged so that its two sides are apart from the L-figured guard ring region 30 by distances a and b, respectively. It is desired to make the distances a and b equal to each other. By making them equal, the distances between the guard ring regions 30 and the first electrode 3 are equal, and therefore the conditions of discharging from the first electrode 3 to the guard ring region 30 become uniform with respect to the two sides. As a result, there is no deviation in discharging characteristics, increasing the discharging resistance.

Especially in the semiconductor apparatus 200, since it is possible to make the side length of the first electrode 3 greater than in the semiconductor apparatus 100, it is possible to make the distances a, b between the first electrode 3 and the guard ring region 30 less than in the semiconductor apparatus 100.

In this manner, by adapting the layout according to the second embodiment of the present invention, the semiconductor apparatus 200 can be highly integrated and miniaturized.

In the semiconductor apparatus 200, the distance between the internal circuitry region 10 and the guard ring region 30 can be made less than in the semiconductor apparatus 100.

In the above embodiment, the longitudinal axis of the protection resistance 2 is parallel to one side of the guard ring region 30. The longitudinal axis can be oriented at any angle with respect to the one side of the guard ring region 30, as long as the distance between the first electrode 3 and the internal circuitry region 10 is greater than the distance between the second electrode 4 and the internal circuitry region 10.

In the above embodiment, the distances a, b from two sides of the first electrode 3 to the guard ring region 30 are set equal. Further, it is desired to also make the distances from two sides of the first electrode 3 to the edges of the well region forming the protection resistance 2 equal. And it is also desired to make the distances from the edges of the well region to the guard ring region 30 equal.

This structure can avoid any deviation in the discharging characteristics and increase the discharging resistance.

Third Embodiment

Figure 3:
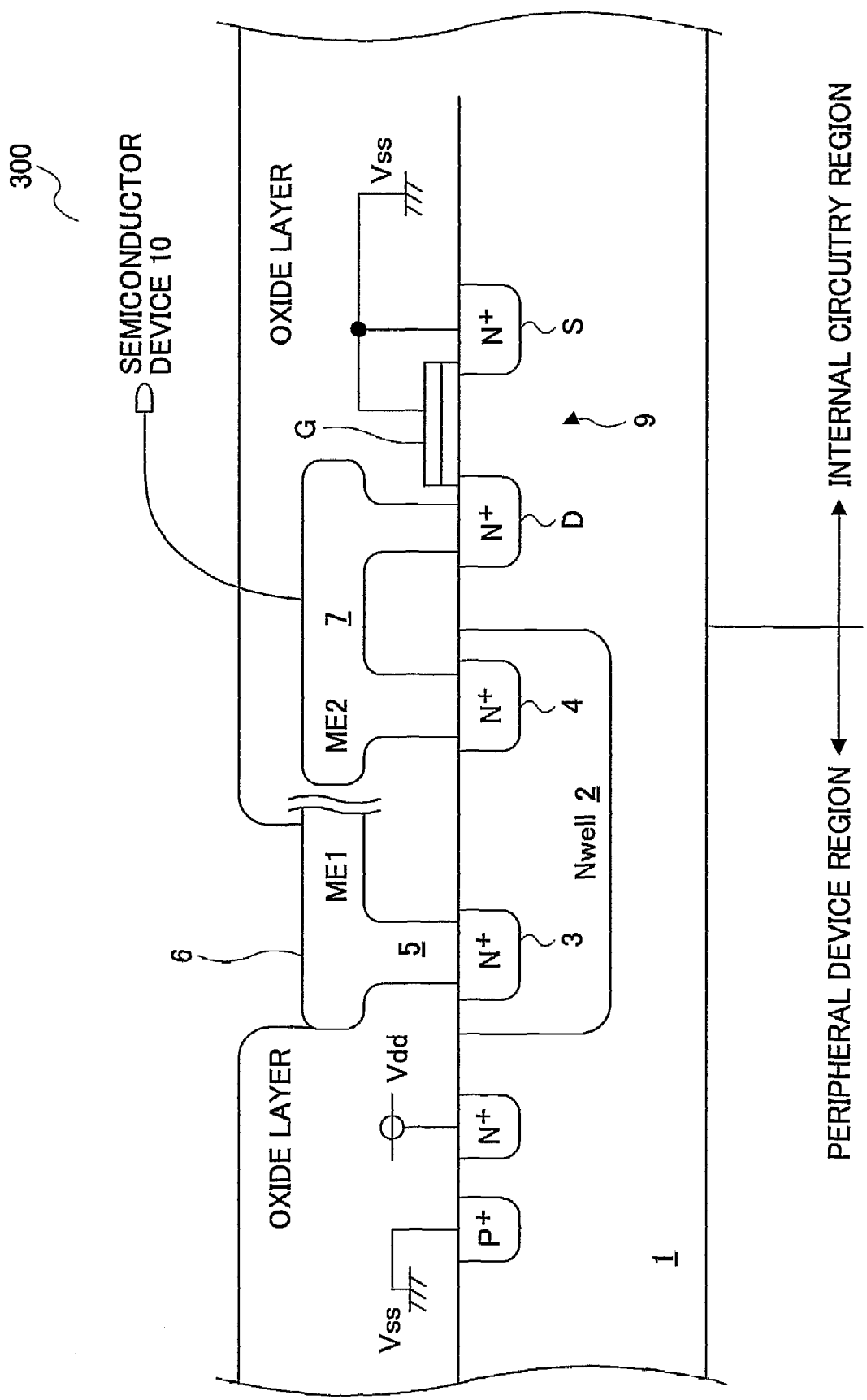
FIG. 3 is a partial cross-sectional view of a semiconductor apparatus according to a third embodiment of the present invention.
Figure 4:
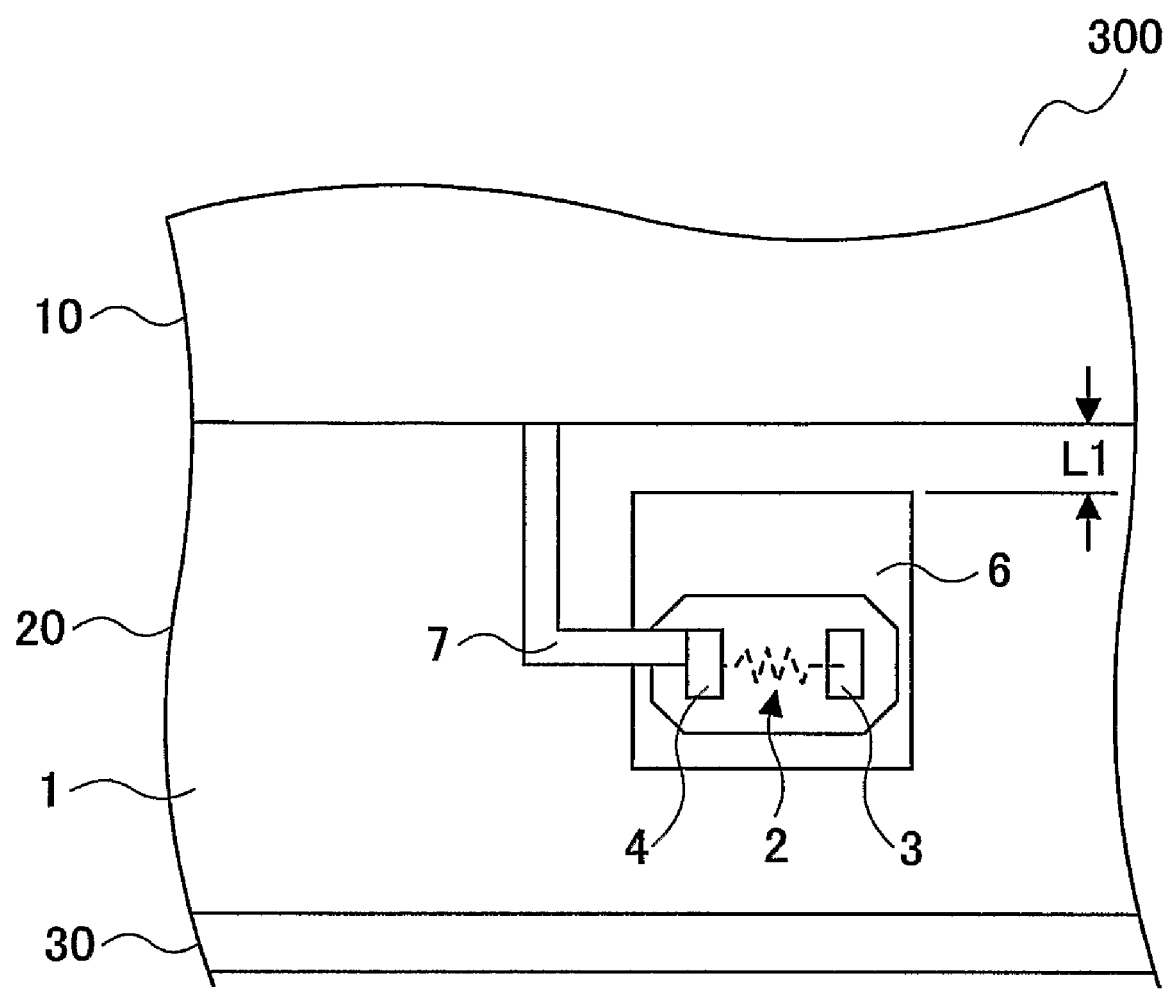
FIG. 4 is a partial layout diagram of the semiconductor apparatus according to the third embodiment of the present invention.

FIG. 3 is a partial cross-sectional view of a semiconductor apparatus 300 according to a third embodiment of the present invention. FIG. 4 is a partial layout view of the semiconductor apparatus 300. The same or similar reference numerals shown in FIG. 4 indicate parts that are the same as or similar to parts shown in FIG. 1.

In the semiconductor apparatus 300, similar to the above semiconductor apparatus 100, a protection resistance 2 is formed in a silicon substrate 1, a second electrode 4 of a protection resistance 2 is connected to internal circuitry 10 via a metal wiring layer 7. An input pad 6 is provided above the protection resistance 2, and connected to a first electrode 3 via a metal wiring layer (not shown). The distance between the input pad 6 and internal circuitry region 10 is L1, the same as in the first and second embodiments.

As shown in FIG. 3, the input pad 6 and the protection resistance 2 are insulated with a silicon oxide layer.

In FIG. 4, the protection resistance 2 that is actually hidden by the input pad 6 is illustrated for easily understanding the layout.

In the layout according to the third embodiment of the present invention, the input pad 6 is provided above the protection resistance 2 and therefore it is possible to highly integrate and miniaturize the semiconductor apparatus 300 while securing enough distance between the first electrode 3 and the internal circuitry region 10.

Especially overlapping the input pad 6 and the protection resistance 2 makes it possible to further miniaturize and highly integrate the semiconductor apparatus 300.

Fourth Embodiment

Figure 5:
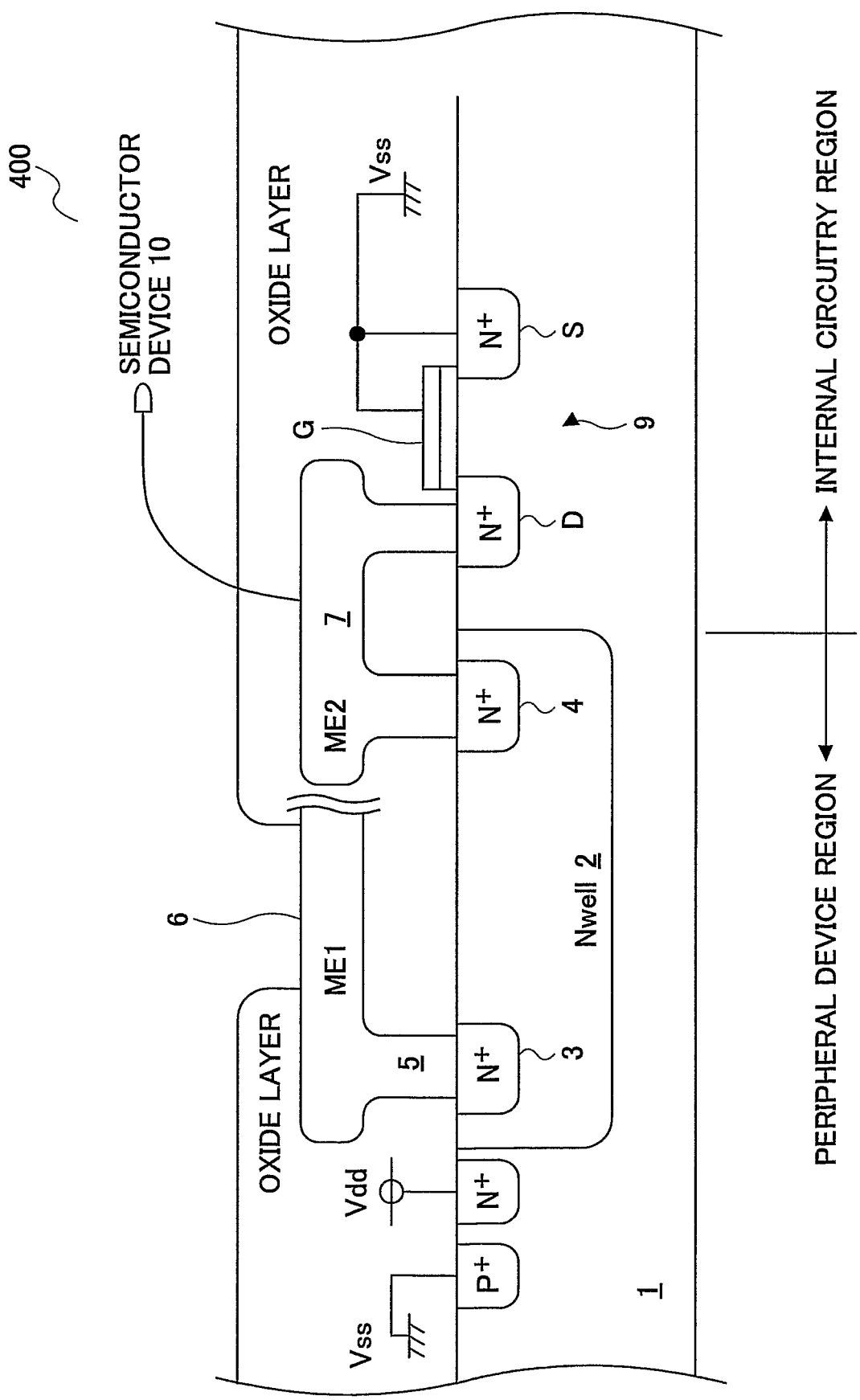
FIG. 5 is a partial cross-sectional view of a semiconductor apparatus according to a fourth embodiment of the present invention.
Figure 6:
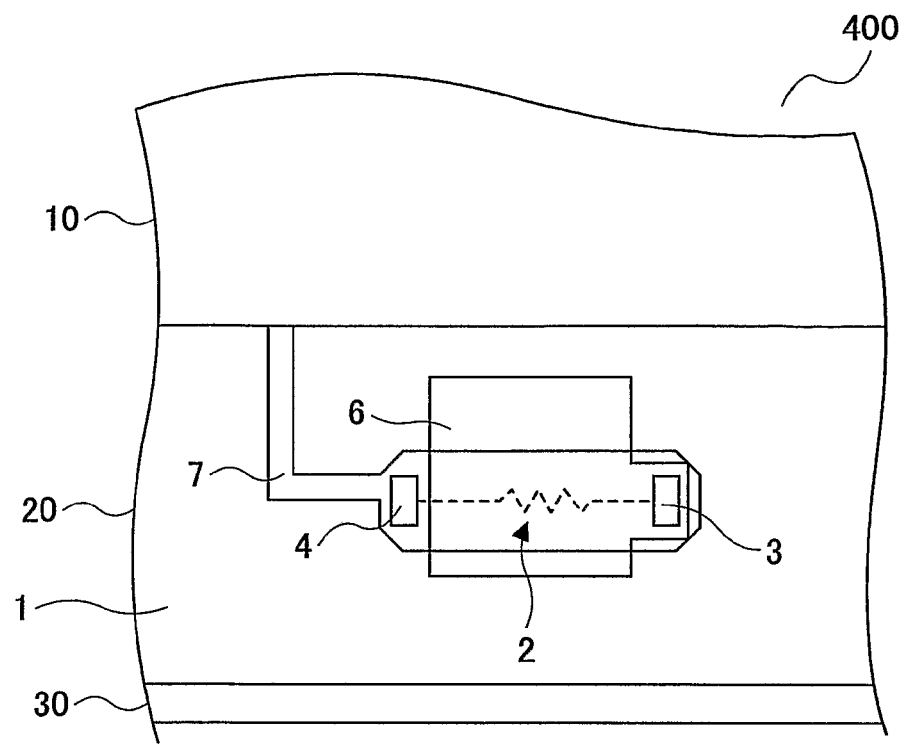
FIG. 6 is a partial layout diagram of the semiconductor apparatus according to the fourth embodiment of the present invention.

FIG. 5 is a partial cross-sectional view of a semiconductor apparatus 400 according to a fourth embodiment of the present invention. FIG. 6 is a partial layout diagram of the semiconductor apparatus 400. The same or similar reference numerals shown in FIG. 6 indicate parts that are the same as or similar to parts in FIG. 1. In FIG. 6, a protection resistance 2 that is actually hidden by an input pad 6 is illustrated for easily understanding the layout.

The semiconductor apparatus 400 has the same structure as the semiconductor apparatus 300 except that the protection resistance 2 is long (the distance between a first electrode 3 and a second electrode 4 is long) and extends out at both sides of the input pad 6. This structure is utilized when increasing a resistant value of the protection resistance 2.

Also in the layout according to the fourth embodiment, it is possible to highly integrate and miniaturize the semiconductor apparatus 400 while securing enough distance between the first electrode 3 and an internal circuitry region 10.

Fifth Embodiment

Figure 7:
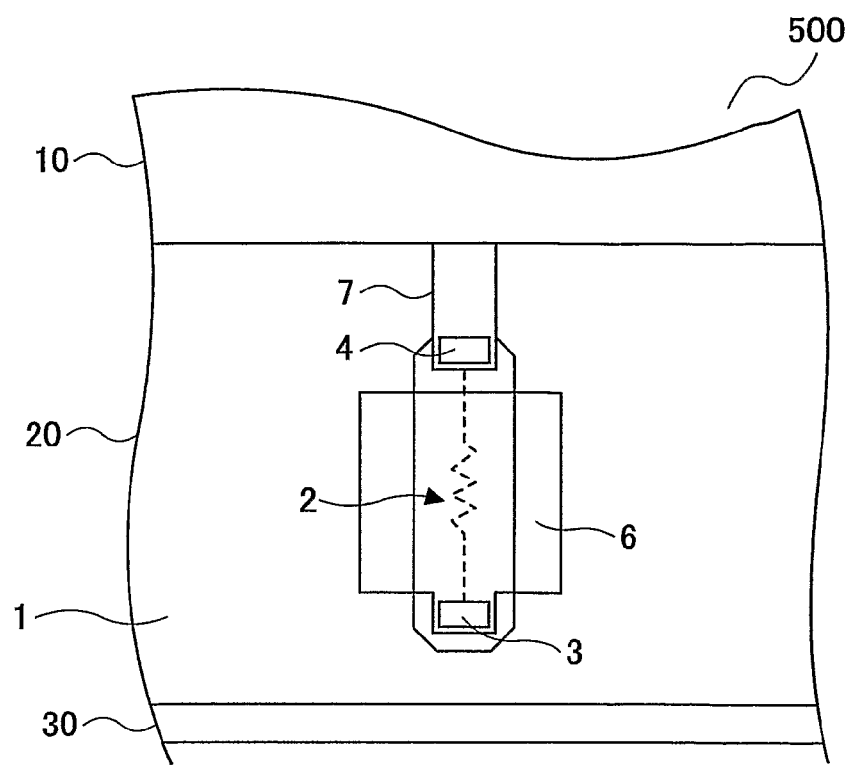
FIG. 7 is a partial layout diagram of the semiconductor apparatus according to a fifth embodiment of the present invention.

FIG. 7 is a partial layout view of a semiconductor apparatus 500 according to a fifth embodiment of the present invention. The same or similar reference numerals shown in FIG. 7 indicate parts that are the same or similar to parts shown in FIG. 1. Also in FIG. 7, a protection resistance 2 that is actually hidden by an input pad 6 is illustrated for easily understanding the layout.

In the above semiconductor apparatus 400, the longitudinal axis (between the first electrode 3 and the second electrode 4) of the protection resistance 2 is substantially parallel to an edge of the internal circuitry region 10. In the semiconductor apparatus 500, the longitudinal axis of a protection resistance 2 is perpendicular to an edge of an internal circuitry region 10. Except for this structure, semiconductor apparatuses 400 and 500 are substantially the same.

In this layout according to the fifth embodiment, by providing the input pad 6 above the protection resistance 2, it is possible to highly integrate and miniaturize the semiconductor apparatus 500 while securing enough distance between the first electrode 3 and the internal circuitry region 10.

Although input pads are utilized for explaining the present invention in the above embodiments, the present invention can be applied to output pads and other pads.

Instead of silicon substrates, other semiconductor substrates such as GaAs, etc., can be used. Further, instead of silicon oxide layers, nitrogen silicon layers, phosphor glass and other insulating materials can be used.

The present application is based on Japanese Priority Patent Application No. 2004-104136 filed on Mar. 31, 2004, with the Japanese Patent Office, the entire contents of which are hereby incorporated by reference.

The invention claimed is:

1. A semiconductor apparatus comprising:
a substrate with a pad;
an internal circuitry region; and
a protection resistance formed on the substrate, the pad being connected to a first electrode of the protection resistance by a wiring;
the internal circuitry region being connected to a second electrode of the protection resistance by a wiring; and
the protection resistance protecting the internal circuitry region from electrostatic discharging;
wherein the pad is placed between the protection resistance and the internal circuitry region, and
wherein the protection resistance comprises a well region formed in the substrate.

2. The semiconductor apparatus as claimed in claim 1, wherein a distance between the pad and the first electrode and a distance between the pad and the second electrode are substantially the same.

3. The semiconductor apparatus as claimed in claim 1, wherein the protection resistance is formed by an impurity diffusion layer.

4. The semiconductor apparatus as claimed in claim 1, wherein a protection circuit is formed by the protection resistance and a protection transistor included in the internal circuitry region.

5. The semiconductor apparatus as claimed in claim 1, wherein the protection resistance comprises a region directly contacting the substrate.

6. A semiconductor apparatus comprising:
a substrate with a pad;
an internal circuitry region; and
a protection resistance formed on the substrate, the pad being connected to a first electrode of the protection resistance by a wiring;
the internal circuitry region being connected to a second electrode of the protection resistance by a wiring; and
the protection resistance protecting the internal circuitry region from electrostatic discharging;
wherein the pad is placed between the protection resistance and the internal circuitry region, and
wherein a distance between the first electrode and the internal circuitry region is greater than a distance between the second electrode and the internal circuitry region.

7. The semiconductor apparatus as claimed in claim 6, wherein
the substrate is provided with a guard ring region surrounding the pad, the internal circuitry region, and the protection resistance; and
distances from two sides of the first electrode being rectangular to the guard ring region adjacent to the first electrode are substantially equal.

8. The semiconductor apparatus as claimed in claim 7, wherein
the protection resistance comprises a well region formed in the substrate; and
distances from the two sides of the first electrode to edge portions of the well region adjacent to the first electrode are substantially equal.

9. The semiconductor apparatus as claimed in claim 8, wherein distances from two edge portions of the well region to the guard ring region adjacent to the well region are substantially equal.

10. The semiconductor apparatus as claimed in claim 6, wherein the pad is placed on an insulating layer on the protection resistance.

* * * * *